US010776139B2

(12) United States Patent
Takeo

(10) Patent No.: US 10,776,139 B2
(45) Date of Patent: Sep. 15, 2020

(54) SIMULATION APPARATUS, SIMULATION METHOD, AND COMPUTER READABLE MEDIUM

(71) Applicant: MITSUBISHI ELECTRIC CORPORATION, Tokyo (JP)

(72) Inventor: Tetsuya Takeo, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 414 days.

(21) Appl. No.: 15/564,314

(22) PCT Filed: May 29, 2015

(86) PCT No.: PCT/JP2015/065501
§ 371 (c)(1),
(2) Date: Oct. 4, 2017

(87) PCT Pub. No.: WO2016/194028
PCT Pub. Date: Dec. 8, 2016

(65) Prior Publication Data
US 2018/0136955 A1 May 17, 2018

(51) Int. Cl.
*G06F 30/20* (2020.01)
*G06F 9/455* (2018.01)
(Continued)

(52) U.S. Cl.
CPC .......... *G06F 9/455* (2013.01); *G06F 9/3005* (2013.01); *G06F 9/30087* (2013.01); *G06F 11/28* (2013.01); *G06F 30/20* (2020.01)

(58) Field of Classification Search
USPC .................. 712/225, 241; 703/6, 22, 26, 14
See application file for complete search history.

(56) References Cited

U.S. PATENT DOCUMENTS 4,625,081 A * 11/1986 Lotito ............... H04M 3/53316
379/196
4,713,748 A * 12/1987 Magar ................ G06F 9/30032
712/225
(Continued)

FOREIGN PATENT DOCUMENTS

GB 2486136 A 6/2012
JP 2000-20348 A 1/2000
(Continued)

*Primary Examiner* — Thai Q Phan
(74) *Attorney, Agent, or Firm* — Birch, Stewart, Kolasch & Birch, LLP

(57) ABSTRACT

In a simulation apparatus (100), a selection unit (101) repetitively selects context information individually generated for each of a plurality of cores and indicating an instruction to be executed by a corresponding one of the plurality of cores. A simulation unit (102) simulates execution of the instruction indicated by the context information of a core during a period from when the context information of the core is selected by the selection unit (101) till when the context information of another core is selected by the selection unit (101). An adjustment unit (103) refers to definition information (251) to individually define a length of the period for at least one or some instructions. If the instruction whose execution is to be simulated by the simulation unit (102) is the at least one or some instructions, then after the context information of a core to execute the at least one or some instructions is selected by the selection unit (101), the adjustment unit (103) adjusts a timing for causing the selection unit (101) to select the context information of another core according to the definition information (251) that is referred to.

15 Claims, 9 Drawing Sheets

(51) Int. Cl.
*G06F 11/28* (2006.01)
*G06F 9/30* (2018.01)

(56) References Cited

U.S. PATENT DOCUMENTS

| | | | | |
|---|---|---|---|---|
| 4,713,749 A * | 12/1987 | Magar | ................ | G06F 9/30167 712/241 |
| 5,671,402 A * | 9/1997 | Nasu | ................ | G06F 11/3419 703/21 |
| 6,856,853 B2 * | 2/2005 | Takahashi | ............ | B25J 9/1666 700/178 |
| 9,904,615 B1 * | 2/2018 | O'Dowd | ............. | G06F 11/3664 |
| 2004/0225405 A1 * | 11/2004 | Takahashi | ............. | B25J 9/1666 700/178 |
| 2006/0229861 A1 * | 10/2006 | Tatsuoka | ................ | G06F 9/52 703/21 |
| 2007/0101318 A1 * | 5/2007 | Tatsuoka | ................ | G06F 9/52 717/135 |
| 2008/0120129 A1 * | 5/2008 | Seubert | ................ | G06Q 10/06 705/35 |
| 2008/0208555 A1 * | 8/2008 | Tatsuoka | ................ | G06F 11/36 703/15 |
| 2010/0269103 A1 * | 10/2010 | Wu | .................... | G06F 17/5022 717/146 |
| 2011/0307860 A1 * | 12/2011 | Park | ........................ | G06F 8/30 717/107 |
| 2012/0101791 A1 * | 4/2012 | Komatsu | ................ | G05B 17/02 703/6 |
| 2016/0011996 A1 * | 1/2016 | Asaad | ..................... | G06F 15/76 710/308 |
| 2016/0026741 A1 * | 1/2016 | Kuwamura | ......... | G06F 17/5009 703/2 |

FOREIGN PATENT DOCUMENTS

| | | |
|---|---|---|
| JP | 2004-21904 A | 1/2004 |
| JP | 2006-293759 A | 10/2006 |
| JP | 2007-122602 A | 5/2007 |
| JP | 2008-210107 A | 9/2008 |
| JP | 2009-140346 A | 6/2009 |
| JP | 2011-215810 A | 10/2011 |
| JP | 2014-211806 A | 11/2014 |
| WO | WO 2011/046089 A1 | 4/2011 |

* cited by examiner

SIMULATION APPARATUS, SIMULATION METHOD, AND COMPUTER READABLE MEDIUM

TECHNICAL FIELD

The present invention relates to a simulation apparatus, a simulation method, and a simulation program.

BACKGROUND ART

In recent years, use of an instruction set simulator (ISS) enables software debugging before production of actual hardware. The ISS is a simulator to convert an instruction set of a target central processing unit (CPU) to an instruction set of a host CPU and execute the instruction set after the conversion. The target CPU is a processor of a target machine to be simulated. The host CPU is a processor of a host machine to execute the simulation.

Conventionally, there is a method of simulating simultaneous operations of a plurality of systems including respective processor cores having different operating frequencies (see, for example, Patent Literature 1). As in this method, simulation of a multi-core CPU system and simulation of a multi-CPU system are also enabled. The multi-core CPU system is a system in which a plurality of cores are mounted in a single processor. The multi-CPU system is a system having a plurality of processors.

CITATION LIST

Patent Literature

Patent Literature 1: JP 2004-21904 A

SUMMARY OF INVENTION

Technical Problem

In the conventional method, a reference clock cycle period is set, and simulation of the plurality of systems is switched for execution, for each one clock cycle period. In this method, a synchronization process is executed for each system, for each clock cycle period. Thus, it takes time to perform the simulation.

An object of the present invention is to speed up simulation.

Solution to Problem

A simulation apparatus according to one aspect of the present invention is a simulation apparatus to simulate parallel processing operations of a system including a plurality of components to individually execute instructions of a program. The simulation apparatus may include:

a selection unit to repetitively select context information individually generated for each of the plurality of components and indicating an instruction to be executed by a corresponding one of the plurality of components;

a simulation unit to simulate execution of the instruction indicated by the context information corresponding to a component during a period from when the context information corresponding to the component is selected by the selection unit till when the context information corresponding to another component is selected by the selection unit;

a storage medium to store definition information to individually define a length of the period for at least one or some instructions out of the instructions to be executed by the plurality of components; and an adjustment unit to, if the instruction whose execution is to be simulated by the simulation unit is the at least one or some instructions, then after the context information corresponding to a component to execute the at least one or some instructions is selected by the selection unit, adjust a timing for causing the selection unit to select the context information corresponding to another component according to the definition information stored in the storage medium.

Advantageous Effects of Invention

In the present invention, a timing for switching simulation of the plurality of components is adjusted depending on execution of which instruction is to be simulated. Therefore, according to the present invention, the simulation can be sped up.

DESCRIPTION OF EMBODIMENTS

Figure 1:
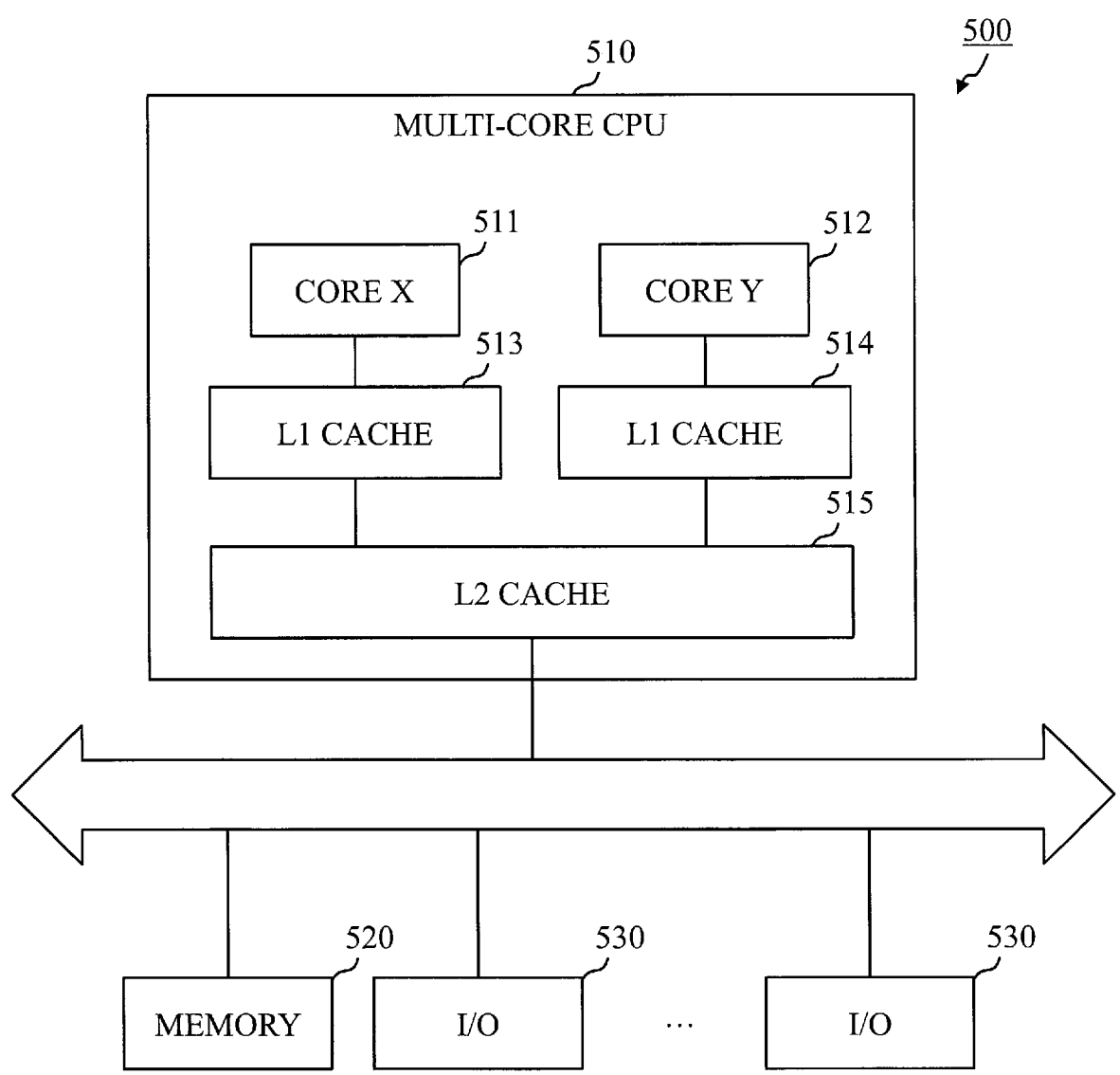
FIG. 1 is a diagram illustrating an example of a hardware configuration of a system whose operations are to be simulated in each embodiment of the present invention.

A description will be given about an example of a hardware configuration of a system 500 whose operations are to be simulated in each embodiment of the present invention, with reference to FIG. 1.

The system 500 includes a multi-core CPU 510, a memory 520, and a plurality of inputs/outputs (I/Os) 530.

The multi-core CPU 510 includes a core X 511, a core Y 512, an L1 cache 513 connected to the core X 511, an L1 cache 514 connected to the core Y 512, and an L2 cache 515 connected to the L1 caches 513 and 514. The multi-core CPU 510 corresponds to a target CPU.

Each I/O 530 is an interface with a peripheral device, a direct memory access (DMA) controller, or the like.

In each embodiment of the present invention, program execution in the system 500 including the multi-core CPU 510 is simulated. As illustrated in FIG. 1, the multi-core CPU 510 is a processor including a plurality of cores. The "plurality of cores" are an example of a plurality of components to individually execute instructions of a program. The "plurality of components" are not limited to two cores as in the example in FIG. 1, and three or more cores may be treated as the "plurality of components". Alternatively, a plurality of processors may be treated as the "plurality of components". That is, each embodiment of the present invention may be modified so that program execution in a multi-CPU system is simulated.

In software processing by multiple cores or multiple CPUs, timings at which synchronization is necessary are limited. Accordingly, simulation can be executed without problem if the synchronization is performed only at those timings. In each embodiment of the present invention, synchronization is not constantly performed for every clock cycle period. Basically, the synchronization is performed for every plurality of clock cycle periods, and synchronization timings are adjusted as necessary. Thus, the simulation can be sped up.

Hereinafter, embodiments of the present invention will be described, using the drawings. Note that, in the respective drawings, same or corresponding portions are given the same reference numeral. Explanation of the same or corresponding portions in the description of the embodiments will be omitted or simplified as necessary.

First Embodiment

A configuration of an apparatus according to this embodiment, operations of the apparatus according to this embodiment, and effects of this embodiment will be sequentially described.

*Description of Configuration*

Figure 2:
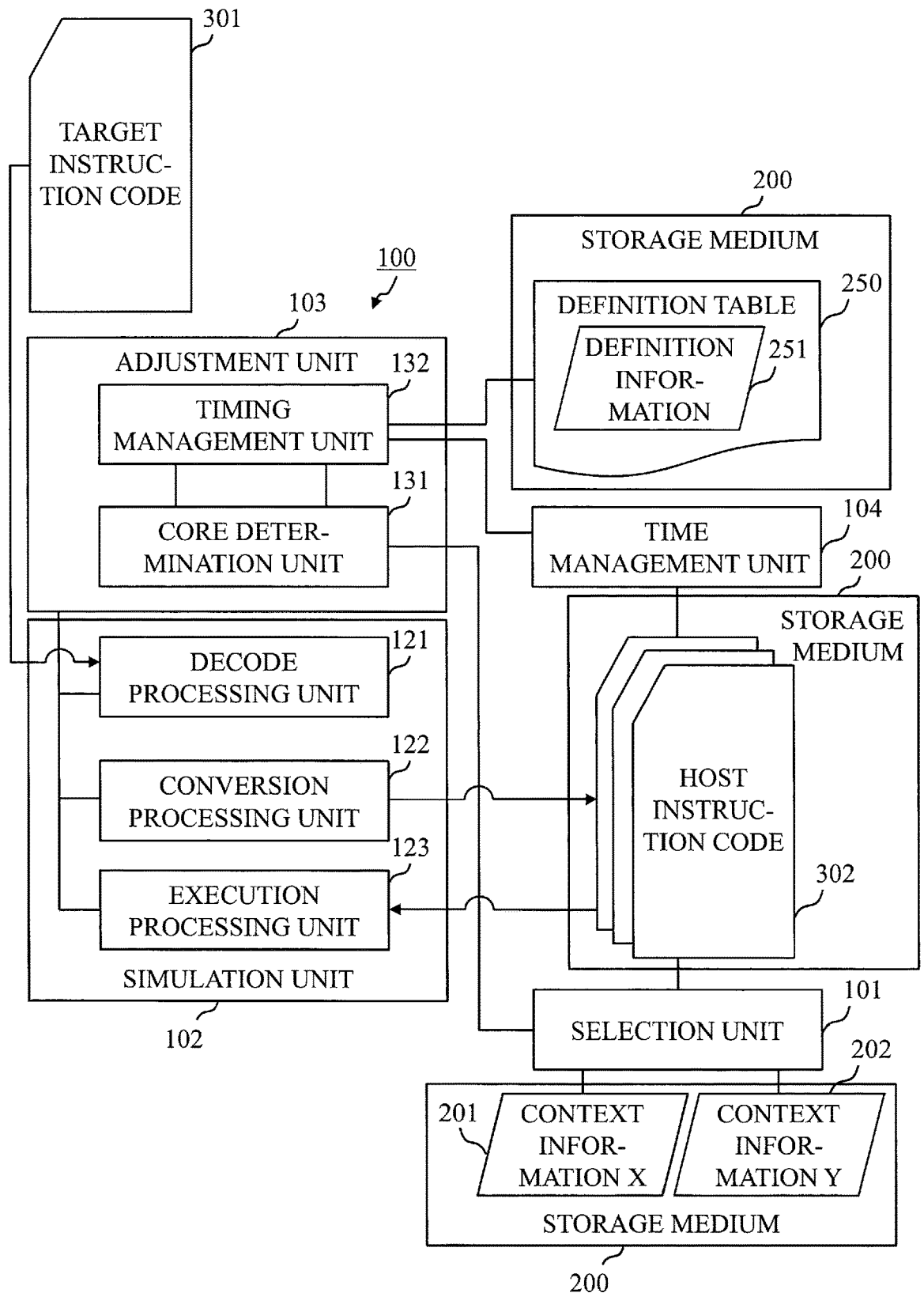
FIG. 2 is a block diagram illustrating a configuration of a simulation apparatus according to a first embodiment.

A configuration of a simulation apparatus 100 that is the apparatus according to this embodiment will be described, with reference to FIG. 2.

The simulation apparatus 100 is an apparatus to simulate parallel processing operations of the system 500 including the core X 511 and the core Y 512, as the "plurality of cores".

The simulation apparatus 100 includes a storage medium 200.

The storage medium 200 stores context information X 201 being context information of the core X 511 and context information Y 202 being context information of the core Y 512. The storage medium 200 stores definition information 251.

The simulation apparatus 100 further includes a selection unit 101, a simulation unit 102, and an adjustment unit 103.

The selection unit 101 repetitively selects the context information stored in the storage medium 200. The context information is individually generated for each of the core X 511 and the core Y 512. The context information indicates an instruction to be executed by a corresponding one of the core X 511 and the core Y 512. That is, the context information X 201 indicates an instruction to be executed by the core X 511. The context information Y 202 indicates an instruction to be executed by the core Y 512. Though simulation of the multi-core system having two cores is executed in this embodiment, three or more cores can be accommodated by preparing the context information corresponding to the number of cores. Alternatively, by preparing the context information for each processor, two or more processors can be accommodated. The context information may be obtained from outside the simulation apparatus 100 instead of being obtained from the storage medium 200.

The simulation unit 102 simulates execution of the instruction indicated by the context information corresponding to a core during a period from when the context information corresponding to the core is selected by the selection unit 101 till when the context information corresponding to another core is selected by the selection unit 101. That is, when the context information X 201 is selected by the selection unit 101, the simulation unit 102 simulates execution of the instruction indicated by the context information X 201 during a period until the context information Y 202 is selected by the selection unit 101. When the context information Y 202 is selected by the selection unit 101, the simulation unit 102 simulates execution of the instruction indicated by the context information Y 202 during a period until the context information X 201 is selected by the selection unit 101. A description will be given later about how the length of the "period" is determined.

The adjustment unit 103 refers to the definition information 251 stored in the storage medium 200. The definition information 251 individually defines the length of the "period" for at least one or some instructions out of the instructions to be executed by the core X 511 and the core Y 512. If the instruction whose execution is to be simulated by the simulation unit 102 is the at least one or some instructions, then after the context information corresponding to a core to execute the at least one or some instructions is selected by the selection unit 101, the adjustment unit 103 adjusts a timing for causing the selection unit 101 to select the context information corresponding to another core according to the definition information 251 that is referred to. That is, if execution of the instruction which is indicated by the context information X 201 and for which an individual period is defined by the definition information 251 is to be simulated by the simulation unit 102, then the adjustment unit 103 controls the selection unit 101 so that the context information Y 202 is selected by the selection unit 101 when the defined individual period has elapsed. If execution of the instruction which is indicated by the context information Y 202 and for which an individual period is defined by the definition information 251 is to be simulated by the simulation unit 102, then the adjustment unit 103 controls the selection unit 101 so that the context information X 201 is selected by the selection unit 101 when the defined individual period has elapsed.

In this embodiment, the definition information 251 defines the length of the "period" by specifying the number of instructions whose execution is to be successively simulated by the simulation unit 102. That is, the definition information 251 specifies the individual number of instructions, as an individual period. Assume that the instruction whose execution is to be simulated by the simulation unit 102 is an instruction for which the individual number of instructions is specified by the definition information 251. Then, after the context information corresponding to a core to execute the instruction is selected by the selection unit 101, the adjustment unit 103 causes the selection unit 101 to select the context information corresponding to another core when execution of one or more instructions, the number of which is specified by the definition information 251, has been simulated by the simulation unit 102. That is, if execution of the instruction which is indicated by the context information X 201 and for which the individual number of instructions is specified by the definition information 251 is to be simulated by the simulation unit 102, then, the instruction being the first instruction, the adjustment unit 103 causes the selection unit 101 to select the context information Y 202 when the number of instructions whose execution has been simulated by the simulation unit 102 reaches the specified number of instructions. If execution of the instruction which is indicated by the context information Y 202 and for which the individual number of instructions is specified by the definition information 251 is to be simulated by the simulation unit 102, then, the instruction being the first instruction, the adjustment unit 103 causes the selection unit 101 to select the context information X 201 when the number of instructions whose execution has been simulated by the simulation unit 102 reaches the specified number of instructions. The definition information 251 may define the length of the "period" by specifying a period of time during which execution of the instructions is to be simulated by the simulation unit 102.

Though the definition information 251 may define the length of the "period" for all the instructions to be executed by the core X 511 and the core Y 512, the definition information 251 in this embodiment defines the length of the "period" for some instructions out of the instructions to be executed by the core X 511 and the core Y 512. Assume that the instruction whose execution is to be simulated by the simulation unit 102 is a different instruction from the one or some instructions. Then, after the context information corresponding to a core to execute the different instruction is selected by the selection unit 101, the adjustment unit 103 causes the selection unit 101 to select the context information corresponding to another core when execution of one or more instructions, the number of which is a fixed number, has been simulated by the simulation unit 102. In this embodiment, however, when execution of a branch or synchronization instruction has been simulated by the simulation unit 102, the adjustment unit 103 causes the selection unit 101 to select the context information corresponding to another core even before the execution of the one or more instructions, the number of which is the fixed number, is simulated by the simulation unit 102. That is, if execution of the instruction which is indicated by the context information X 201 and for which the individual number of instructions is not specified by the definition information 251 is to be simulated by the simulation unit 102, then, the instruction being the first instruction, the adjustment unit 103 causes the selection unit 101 to select the context information Y 202 when the number of instructions whose execution has been simulated by the simulation unit 102 reaches the fixed number set in advance or when the execution of the branch or synchronization instruction has been simulated by the simulation unit 102. If execution of the instruction which is indicated by the context information Y 202 and for which the individual number of instructions is not specified by the definition information 251 is to be simulated by the simulation unit 102, then, the instruction being the first instruction, the adjustment unit 103 causes the selection unit 101 to select the context information X 201 when the number of instructions whose execution has been simulated by the simulation unit 102 reaches the fixed number set in advance or when the execution of the branch or synchronization instruction has been simulated by the simulation unit 102.

In this embodiment, the simulation unit 102 converts a target instruction code 301 that is an instruction code of the target CPU to a host instruction code 302 that is an instruction code of a host CPU and executes the host instruction code 302. The adjustment unit 103 manages processes of the simulation unit 102.

The simulation unit 102 includes a decode processing unit 121, a conversion processing unit 122, and an execution processing unit 123.

The decode processing unit 121 performs an instruction decode process. Specifically, in accordance with a command from the adjustment unit 103, the decode processing unit 121 checks whether a host instruction code 302 is stored in the storage medium 200 with respect to the address of a target instruction code 301 that can be executed by the target CPU. When the host instruction code 302 is not stored in the storage medium 200, the decode processing unit 121 interprets the type of the instruction included in the target instruction code 301, and respective registers or memory addresses that serve as the source and destination of the instruction.

The conversion processing unit 122 performs an instruction conversion process. Specifically, the conversion processing unit 122 converts the target instruction code 301 interpreted by the decode processing unit 121 to one or more host instruction codes 302 that can be executed by the host CPU. The conversion processing unit 122 stores the one or more host instruction codes 302 in the storage medium 200.

The execution processing unit 123 performs an instruction execution process. Specifically, the execution processing unit 123 executes the one or more host instruction codes 302 stored in the storage medium 200 by the conversion processing unit 122 and corresponding to the target instruction code 301 to be executed, thereby performing simulation.

When simulation of a target instruction code 301 that has been executed once is executed again, the decode processing unit 121 searches the storage medium 200. If corresponding one or more host instruction codes 302 are stored, the adjustment unit 103 issues an instruction execution process command to the execution processing unit 123 without issuing an instruction decode process command to the decode processing unit 121 and without issuing an instruction conversion process command to the conversion processing unit 122. By omitting the instruction decode process and the instruction conversion process and by performing the instruction execution process alone, simulation can be performed at high speed.

The adjustment unit 103 includes a core determination unit 131 and a timing management unit 132.

The core determination unit 131 determines whether the target instruction code 301 to be subsequently executed is an instruction code of the core X 511 or an instruction code of the core Y 512. The core determination unit 131 transmits to the selection unit 101 the context information to be selected, according to a result of the determination. The context information X 201 and the context information Y 202 include information on internal registers of the target CPU, information on addresses held by the cores, and information on resources such as time and interrupt, which are necessary when the core X 511 and the core Y 512 of the target CPU execute target instruction codes 301, respectively. When the cores are switched at a time of simulation execution, the decode processing unit 121, the conversion processing unit 122, and the execution processing unit 123 that are common can be used by switching the context information as well.

When the target instruction code 301 to be subsequently executed is the instruction code of the core X 511, the selection unit 101 reads the context information X 201. When the target instruction code 301 to be subsequently executed is the instruction code of the core Y 512, the selection unit 101 reads the context information Y 202. The selection unit 101 provides the context information that has been read, as resource information to be used for the instruction execution process by the execution processing unit 123.

The simulation apparatus 100 further includes a time management unit 104.

The time management unit 104 simulates a time lapse of the target CPU according to execution of each host instruction code 302. Each time one host instruction code 302 is executed, the time management unit 104 computes a period of time taken for the execution and a period of time taken for a memory access, an I/O access, and so on, and reflects results of the computations on the context information X 201 and the context information Y 202 provided for the respective cores. Basically, time information of each core is synchronized for each certain timing. The time information of each core can be used with an instruction execution status, as performance information.

When a synchronization timing is fixed, times of the respective cores are synchronized for a short interval of each instruction, thereby enabling simulation with a good time accuracy. However, a simulation period is increased. Assume that the simulation period is long. Then, when simulation of a large program is executed or when simulation is repetitively executed, poor efficiency is obtained. By extending an interval of synchronizing the times of the respective cores to a certain degree, the simulation period can be reduced. However, time accuracy deteriorates and data to be used for performance analysis cannot be collected. Further, when the interval of synchronizing the times of the respective cores is too long, a problem may occur in a software operation. Specifically, a computation error that cannot be corrected later or that is not permitted to be corrected later, use of erroneous data, or the like may occur.

When performing performance analysis, there is a case where an overall operation of a program is desired to be grasped and a case where a processing status of a part of the program is desired to be analyzed. When performing program development or hardware development, or at a time of occurrence of a trouble due to a performance problem after shipment, an operation status of a specific task or process is often desired to be analyzed in detail. Thus, in this embodiment, an address range of a target instruction code 301 for execution of the specific task or process, a demanded accuracy, and a synchronization interval are defined in a definition table 250 in advance. The synchronization interval is defined by the number of instructions, as described above. When the address of the target instruction code 301 whose simulation is to be executed is included in a range defined in the definition table 250, the timing management unit 132 adjusts the interval of synchronizing the time of the respective cores to the interval defined in the definition table 250. If the address of the target instruction code 301 whose simulation is to be executed is not included in the range defined in the definition table 250, the timing management unit 132 can set the interval of synchronizing the times of the respective cores to be long at a level that will cause no problem in the software operation.

The definition information 251 is stored in the definition table 250. As described above, in this embodiment, the definition information 251 defines the length of the "period" for each address range of the memory 520 included in the system 500, where the instructions are stored.

Figure 3:
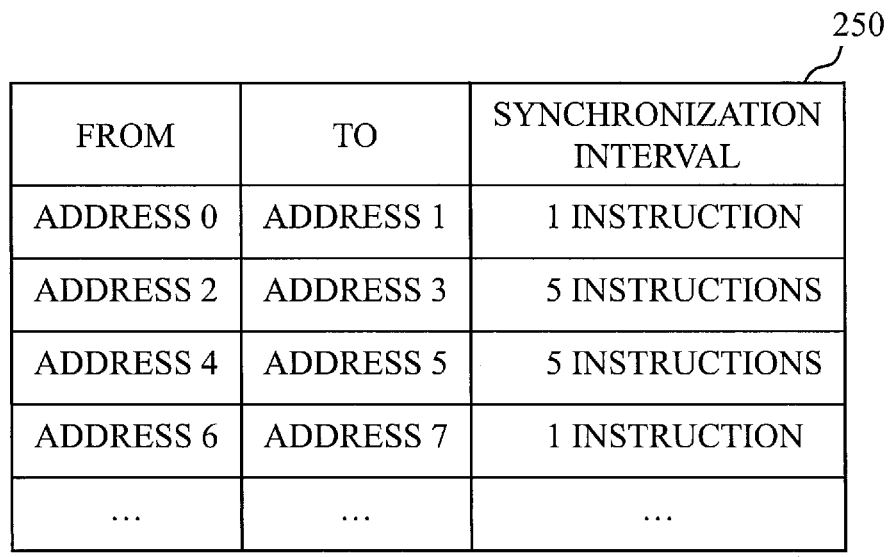
FIG. 3 is a diagram illustrating an example of a definition table in the simulation apparatus according to the first embodiment.

FIG. 3 illustrates an example of the definition table 250. In this example, the definition table 250 illustrates each set of start and end addresses for disposing the instructions to be analyzed in detail, and the number of instructions for a corresponding synchronization interval. The start address and the end address may be replaced with the start address and the instruction size. The number of instructions for the corresponding synchronization interval may be replaced with a period of time of the corresponding synchronization interval.

In this embodiment, a timing for synchronizing the times of the respective cores is dynamically adjusted. With this arrangement, among the instructions of the program to be simulated, simulation with a good time accuracy can be performed for the instruction disposed within an address region necessary for the performance analysis, and simulation at high speed can be performed for the instruction disposed outside the address region necessary for the performance analysis.

In this embodiment, the "plurality of components" are the plurality of cores of the processor. As described above, the "plurality of components" may be the plurality of processors. That is, in this embodiment, simulation of the multi-core system is performed; however, simulation of the multi-CPU system may be performed by a similar method.

\*\*\*Description of Operations\*\*\*

Operations of the simulation apparatus 100 will be described, with reference to FIG. 4. The operations of the simulation apparatus 100 correspond to a simulation method according to this embodiment. The operations of the simulation apparatus 100 correspond to a processing procedure of a simulation program according to this embodiment.

In step S11, the core determination unit 131 that is a constituent of the adjustment unit 103 determines the core to subsequently execute an instruction. When there is no difference in instruction execution statuses of the respective cores, or when time lapses of the respective cores are equivalent, the core determination unit 131 selects an arbitrary core. When there is a difference in the instruction execution statuses of the respective cores, or when a time of one of the cores is ahead, the core determination unit 131 selects the core whose time is delayed.

In step S12, the selection unit 101 selects the context information of the core selected in step S11, as reference information for execution of the instructions.

An execution instruction address that is the address of the instruction to be subsequently executed by the core selected in step S11 is defined by the context information of that core. In step S13, if the instruction at the execution instruction address constitutes a target instruction code 301 that is not converted to a host instruction code 302, the flow proceeds to step S14. If the instruction at the execution instruction address constitutes a target instruction code 301 that has already been converted to the host instruction code 302, the flow proceeds to step S19.

In step S14, the decode processing unit 121 that is a constituent of the simulation unit 102 loads the target instruction code 301 at the execution instruction address.

In step S15, the decode processing unit 121 decodes the target instruction code 301 loaded in step S14.

In step S16, the conversion processing unit 122 that is a constituent of the simulation unit 102 converts the target instruction code 301 decoded in step S15 to one or more host instruction codes 302. The host instruction codes 302 are an instruction string including one or more instructions. The conversion processing unit 122 embeds internal resource information of a register and so on into the one or more host instruction codes 302 by referring to the context information selected in step S12.

In step S17, the conversion processing unit 122 stores the one or more host instruction codes 302 obtained in step S16 in the storage medium 200 as one block.

In step S18, the timing management unit 132 that is a constituent of the adjustment unit 103 refers to the definition table 250 to determine whether the execution instruction address of the instruction converted in step S16 is within the range defined in the definition table 250. If the execution instruction address is within the range defined in the definition table 250, the timing management unit 132 determines whether the number of instructions converted in step S15 which has occurred since step S12 occurred last is less than the number of instructions for the synchronization interval defined in the definition table 250. If the number of the converted instructions is less than the number of instructions for the synchronization interval, the flow returns to step S13. If the number of the converted instructions is not less than the number of instructions for the synchronization interval, the flow proceeds to step S19. If the execution instruction address is outside the range defined in the definition table 250, the timing management unit 132 determines whether the number of the converted instructions is less than the certain number of instructions. If the number of the converted instructions is less than the certain number of instructions, the flow returns to step S13. If the number of the converted instructions is not less than the certain number of instructions, the flow proceeds to step S19.

If the flow returns from step S18 to step S13 and the processes from step S14 to step S17 are performed, that is, if the instruction decode process and the instruction conversion process are continuously performed, the host instruction codes 302 obtained in step S16 are stored in the storage medium 200 as the same block. At a point of time when the flow proceeds to step S19, that is, at a point of time when the instruction decode process and the instruction conversion process are completed, registration of that block is completed.

In step S19, the execution processing unit 123 that is a constituent of the simulation unit 102 executes the one or more host instruction codes 302 obtained in step S17. The one or more host instruction codes 302 are executed for each block. When execution of one block is completed, time lapses of the cores are synchronized. That is, after step S19, the flow returns to step S11, and the core out of the core X 511 and the core Y512 whose time lapse is delayed is selected, as the core that is to subsequently execute an instruction.

In this embodiment, the synchronization interval defined in the definition table 250 is the number of instructions to be converted into one block in the processes from step S14 to step S17. Each time when execution of one block is finished, synchronization between the cores is performed. Thus, by changing the number of instructions to be converted into one block according to the address range of the target instruction code 301, the synchronization can be performed at timings at which the synchronization is necessary. With respect to the target instruction code 301 whose address is not included in the range defined in the definition table 250, one or more instructions, the number of which is the certain number defined in advance, are converted into the same block. Therefore, the number of times of synchronization is greatly reduced though a synchronization interval is extended. Accordingly, host instruction codes 302 can be executed at high speed. The "certain number defined in advance" is in the order of dozens of instructions. As described above, a method of closing each block using a branch instruction or a synchronization instruction is also used together.

Figure 5:
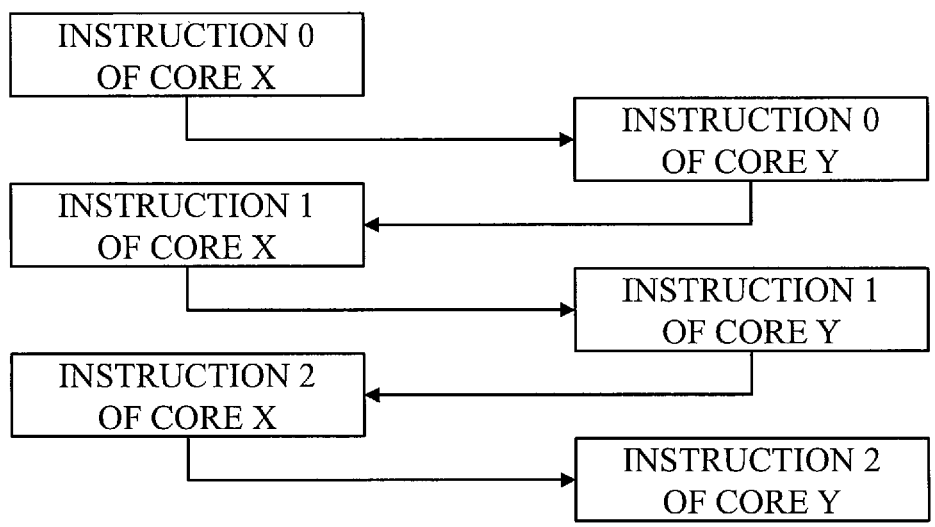
FIG. 5 is a diagram illustrating an example of a synchronization process of the simulation apparatus according to the first embodiment.

FIG. 5 illustrates an example of a synchronization process of the simulation apparatus 100. It is assumed in this example that addresses of instructions 0 to 2 of the core X 511 and addresses of instructions 0 to 2 of the core Y 512 are all within the ranges defined in the definition table 250. It is assumed that the number of instructions for the synchronization interval with respect to each of those ranges defined in the definition table 250 is 1.

It is assumed that the core X 511 has been first selected, and that execution of the instruction 0 of the core X 511 has been simulated. With respect to the instruction 0 of the core X 511, the number of instructions for the synchronization interval is 1. Thus, execution of one block is completed at a point of time when execution of the instruction 0 of the core X 511 has been simulated. Since a situation occurs where the time of the core X 511 advances just by one instruction, the core Y 512 is subsequently selected, and execution of the instruction 0 of the core Y 512 is simulated. This synchronizes the times of the core X 511 and the core Y 512. It may be so arranged that the core Y 512 is first selected and that execution of the instruction 0 of the core Y 512 is simulated.

With respect to the instruction 0 of the core Y 512 as well, the number of instructions for the synchronization interval is 1. Thus, execution of one block is completed at a point of time when execution of the instruction 0 of the core Y 512 has been simulated. Subsequently, the core X 511 may be selected, or the core Y 512 may be selected because the selection is to be made immediately after the times of the core X 511 and the core Y 512 is synchronized. It is assumed herein that the core X 511 has been selected and execution of the instruction 1 of the core X 511 has been simulated. With respect to the instruction 1 of the core X 511 as well, the number of instructions for the synchronization interval is 1. Thus, execution of one block is completed at a point of time when execution of the instruction 1 of the core X 511 has been simulated. Since a situation occurs again where the time of the core X 511 advances just by one instruction, the core Y 512 is subsequently selected, and execution of the instruction 1 of the core Y 512 is simulated. This synchronizes the times of the core X 511 and the core Y 512. Thereafter, the instruction 2 of the core X 511 and the instruction 2 of the core Y 512 are sequentially executed in a similar way. When time lapses differ for each instruction, time comparison is made for core selection. That is, the core whose time is delayed is selected.

Figure 6:
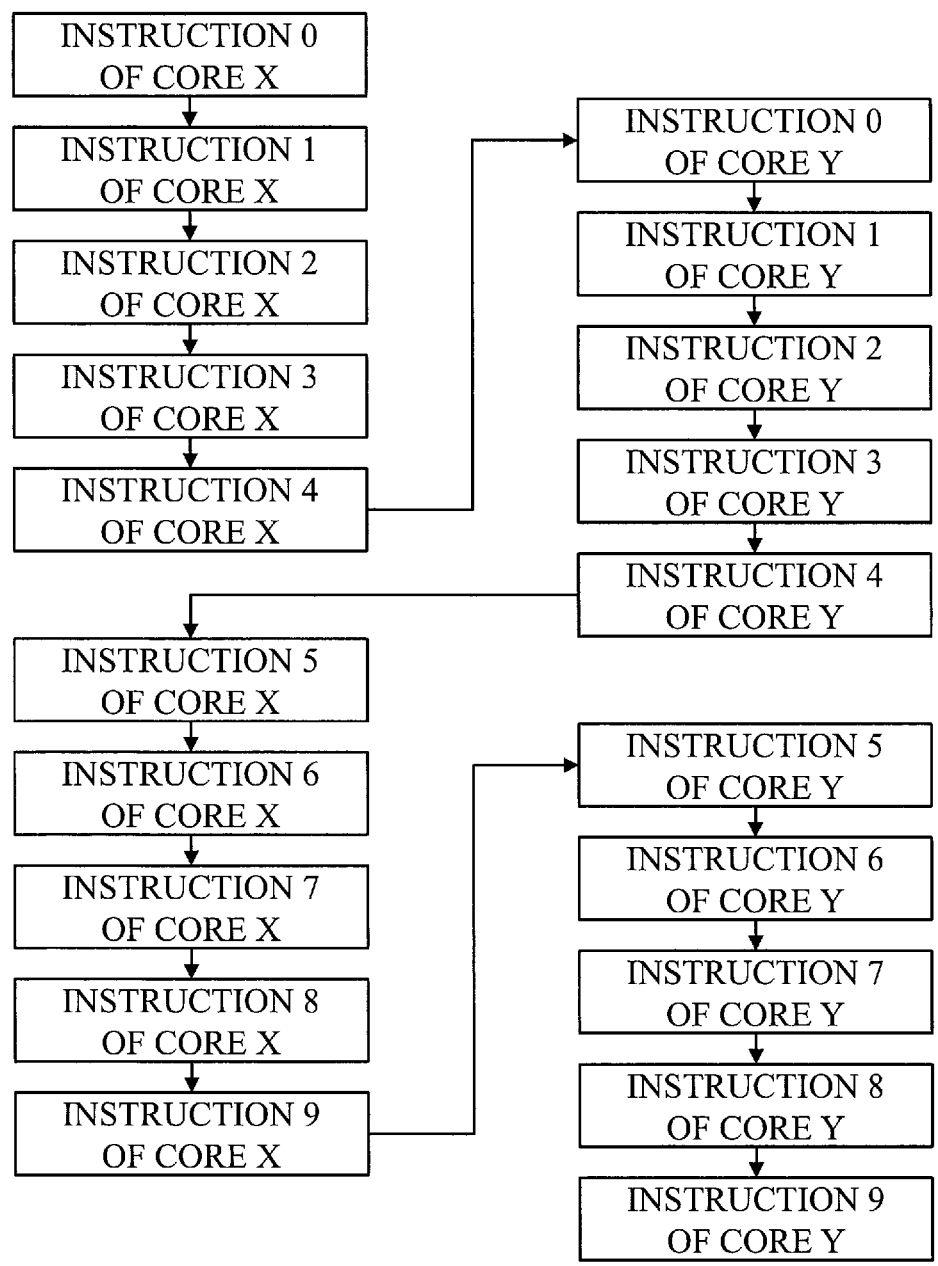
FIG. 6 is a diagram illustrating an example of the synchronization process of the simulation apparatus according to the first embodiment.

FIG. 6 illustrates another example of the synchronization process of the simulation apparatus 100. It is assumed in this example that addresses of instructions 0 to 9 of the core X 511 and addresses of instructions 0 to 9 of the core Y 512 are all within the ranges defined in the definition table 250. It is assumed that the number of instructions for the synchronization interval with respect to each of those ranges of defined in the definition table 250 is 5. Even if the addresses of the instructions 0 to 9 of the core X 511 and the addresses of the instructions 0 to 9 of the core Y 512 are outside the ranges defined in the definition table 250, the process is the same as that illustrated in FIG. 6 if the "certain number defined in advance" is 5.

It is assumed that the core X 511 has been first selected, and that execution of the instruction 0 of the core X 511 has been simulated. With respect to the instructions 0 to 4 of the core X 511, the number of instructions for the synchronization interval is 5. Thus, execution of one block is not completed at a point of time when execution of the instruction 0 of the core X 511 has been simulated. Accordingly, execution of the instructions 1 to 4 of the core X 511 is successively simulated. Execution of one block is completed at a point of time when execution of the instruction 4 of the core X 511 has been simulated. Since a situation occurs where the time of the core X 511 advances just by 5 instructions, the core Y 512 is subsequently selected, and execution of the instruction 0 of the core Y 512 is simulated.

With respect to the instructions 0 to 4 of the core Y 512 as well, the number of instructions for the synchronization interval is 5. Thus, execution of one block is not completed at a point of time when execution of the instruction 0 of the core Y 512 has been simulated. Accordingly, execution of the instructions 1 to 4 of the core Y 512 is successively simulated. This synchronizes the times of the core X 511 and the core Y 512. It may be so arranged that the core Y 512 is first selected and that execution of the instruction 0 of the core Y 512 is simulated.

Execution of one block is completed at a point of time when execution of the instruction 4 of the core Y 512 has been simulated. Subsequently, the core X 511 may be selected, or the core Y 512 may be selected because the selection is to be made immediately after the times of the core X 511 and the core Y 512 are synchronized. It is assumed herein that the core X 511 has been selected and execution of the instruction 5 of the core X 511 has been simulated. With respect to the instructions 5 to 9 of the core X 511 as well, the number of instructions for the synchronization interval is 5. Thus, execution of one block is not completed at a point of time when execution of the instruction 5 of the core X 511 has been simulated. Accordingly, execution of the instructions 6 to 9 of the core X 511 is successively simulated. Execution of one block is completed at a point of time when execution of the instruction 9 of the core X 511 has been simulated. Since a situation occurs again where the time of the core X 511 advances just by 5 instructions, the core Y 512 is subsequently selected, and execution of the instruction 5 of the core Y 512 is simulated. With respect to the instructions 5 to 9 of the core Y 512 as well, the number of instructions for the synchronization interval is 5. Thus, execution of one block is not completed at a point of time when execution of the instruction 5 of the core Y 512 has been simulated. Accordingly, execution of the instructions 6 to 9 of the core Y 512 is successively simulated. This synchronizes the times of the core X 511 and the core Y 512.

*Description of Effect*

In this embodiment, a timing for switching simulation of the core X 511 and the core Y 512 is adjusted depending on execution of which instruction is to be simulated. Therefore, according to this embodiment, the simulation can be sped up.

Second Embodiment

With respect to this embodiment, a difference from the first embodiment will be mainly described.

A configuration of a simulation apparatus 100 according to this embodiment will be described, with reference to FIG. 7.

As in the first embodiment, definition information 251 is stored in a definition table 250. In the first embodiment, the definition information 251 defines the length of the "period" for each address range of the memory 520 included in the system 500, where the instructions are stored. On the other hand, in this embodiment, the definition information 251 defines the length of a "period" for each identifier (ID) to identify, among functions included in a program to be executed by the system 500, a function corresponding to at least one or some instructions.

Figure 8:
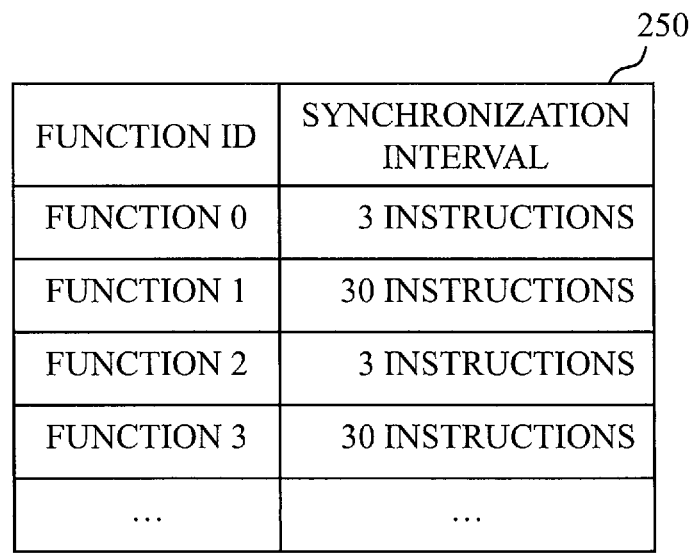
FIG. 8 is a diagram illustrating an example of a definition table in the simulation apparatus according to the second embodiment.

FIG. 8 illustrates an example of the definition table 250. In this example, the definition table 250 gives an ID for each function to execute one or more instructions to be analyzed in detail and the number of instructions for a corresponding synchronization interval. The number of instructions for the corresponding synchronization interval may be replaced with a period of time of the corresponding synchronization interval.

Figure 7:
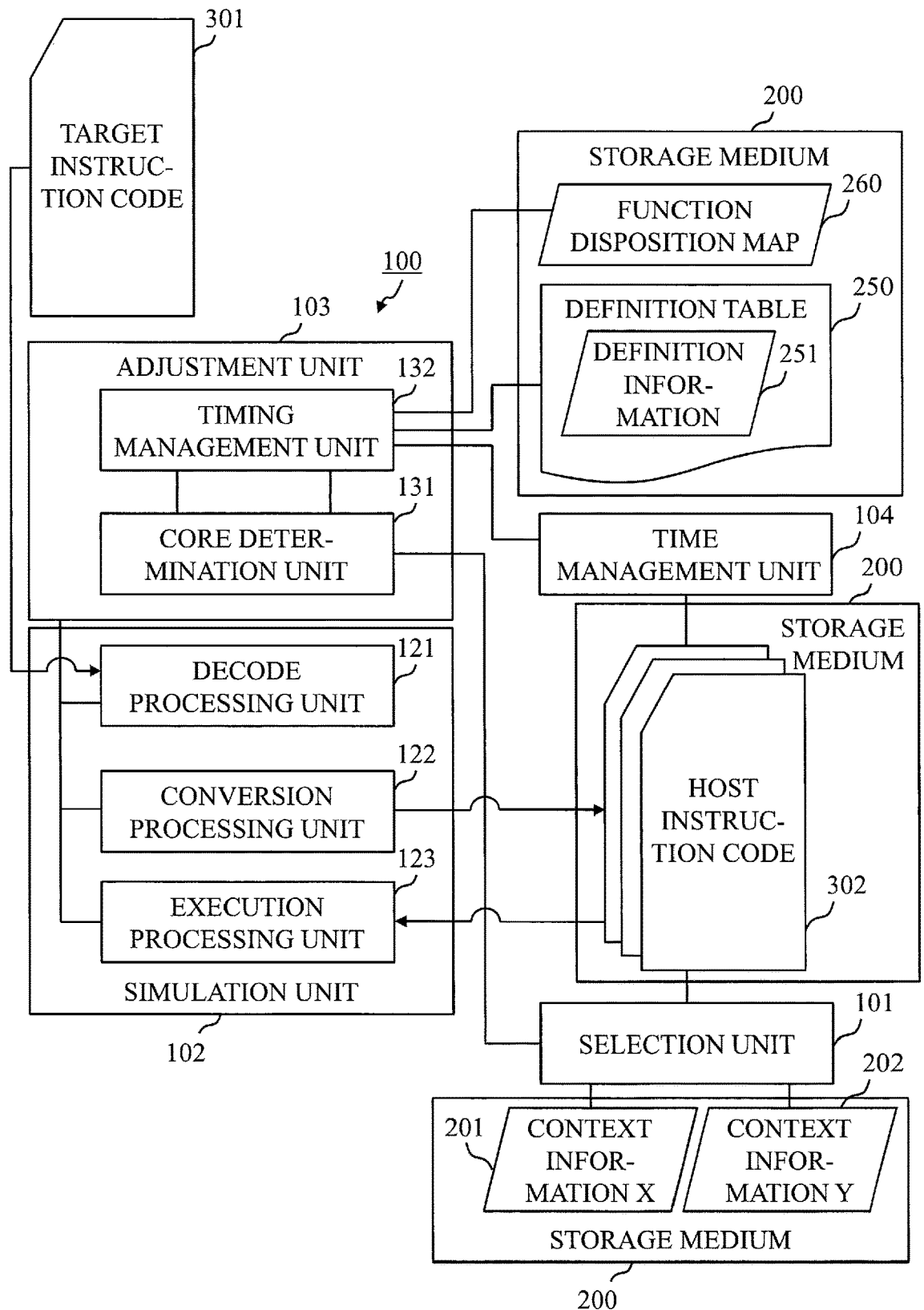
FIG. 7 is a block diagram illustrating a configuration of a simulation apparatus according to a second embodiment.

As illustrated in FIG. 7, in this embodiment, a function disposition map 260 is stored in the storage medium 200. The function disposition map 260 includes address map information on each function to be generated when the program to be simulated is compiled and linked.

Figure 4:
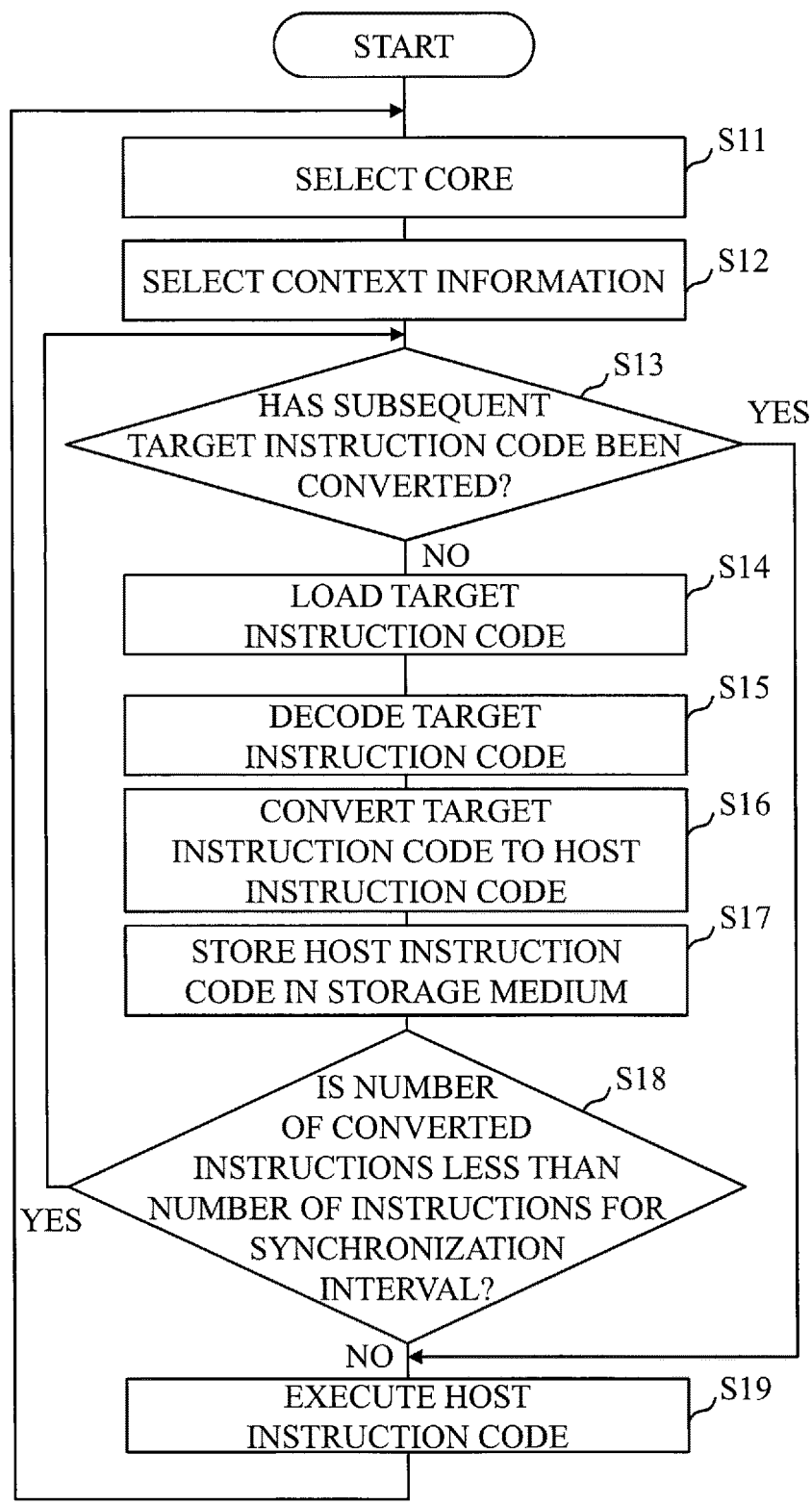
FIG. 4 is a flowchart illustrating operations of the simulation apparatus according to the first embodiment.

Operations of the simulation apparatus 100 are the same as those in the first embodiment illustrated in FIG. 4, except step S18.

In step S18, a timing management unit 132 that is a constituent of an adjustment unit 103 identifies an execution task which is a function to execute an instruction converted in step S16, based on information of the function disposition map 260. The timing management unit 132 refers to the definition table 250 to determine whether the identified execution task is defined in the definition table 250. If the execution task is defined in the definition table 250, the timing management unit 132 determines whether the number of instructions converted in step S15 which has occurred since step S12 occurred last is less than the number of instructions for the synchronization interval defined in the definition table 250. If the number of the converted instructions is less than the number of instructions for the synchronization interval, the flow returns to step S13. If the number of the converted instructions is not less than the number of instructions for the synchronization interval, the flow proceeds to step S19. If the execution task is not defined in the definition table 250, the timing management unit 132 determines whether the number of the converted instructions is less than the certain number of instructions. If the number of the converted instructions is less than the certain number of instructions, the flow returns to step S13. If the number of the converted instructions is not less than the certain number of instructions, the flow proceeds to step S19.

In this embodiment, the synchronization interval defined in the definition table 250 is the number of instructions to be converted into one block in the processes from step S14 to step S17, as in the first embodiment. Each time execution of one block is finished, synchronization between the cores is performed. Thus, by changing the number of instructions to be converted into one block according to the function of a target instruction code 301, the synchronization can be performed at timings at which the synchronization is necessary. With respect to the target instruction code 301 whose function is not defined in the definition table 250, one or more instructions, the number of which is the certain number defined in advance, are converted into the same block. Therefore, the number of times of synchronization is greatly reduced though a synchronization interval is extended. Accordingly, a host instruction code 302 can be executed at high speed. In this embodiment as well, the method of closing each block using a branch instruction or a synchronization instruction is also used together.

Hereinafter, an example of a hardware configuration of the simulation apparatus 100 according to each embodiment of the present invention will be described with reference to FIG. 9.

The simulation apparatus 100 is a computer. The simulation apparatus 100 includes hardware devices such as a processor 901, an auxiliary storage device 902, a memory 903, a communication device 904, an input interface 905, and a display interface 906. The processor 901 is connected to the other hardware devices via a signal line 910, and controls the other hardware devices. The input interface 905 is connected to an input device 907. The display interface 906 is connected to a display 908.

The processor 901 is an integrated circuit (IC) to perform processing. The processor 901 corresponds to the host CPU.

The auxiliary storage device 902 is a read only memory (ROM), a flash memory, or a hard disk drive (HDD), for example. The auxiliary storage device 902 corresponds to the storage medium 200.

The memory 903 is a random access memory (RAM), for example. The memory 903 corresponds to the storage medium 200.

The communication device 904 includes a receiver 921 to receive data and a transmitter 922 to transmit data. The communication device 904 is a communication chip or a network interface card (NIC), for example.

The input interface 905 is a port to which a cable 911 of the input device 907 is connected. The input interface 905 is a universal serial bus (USB) terminal, for example.

The display interface 906 is a port to which a cable 912 of the display 908 is connected. The display interface 906 is a USB terminal or a high definition multimedia interface (HDMI (registered trademark)) terminal, for example.

The input device 907 is a mouse, a stylus, a keyboard, or a touch panel, for example.

The display 908 is a liquid crystal display (LCD), for example.

A program to implement functions of "units" such as the selection unit 101, the simulation unit 102, and the adjustment unit 103 is stored in the auxiliary storage device 902. This program is loaded into the memory 903, read into the processor 901, and executed by the processor 901. An operating system (OS) is also stored in the auxiliary storage device 902. At least part of the OS is loaded into the memory 903, and the processor 901 executes the program to implement the functions of the "units" while executing the OS.

Figure 9:
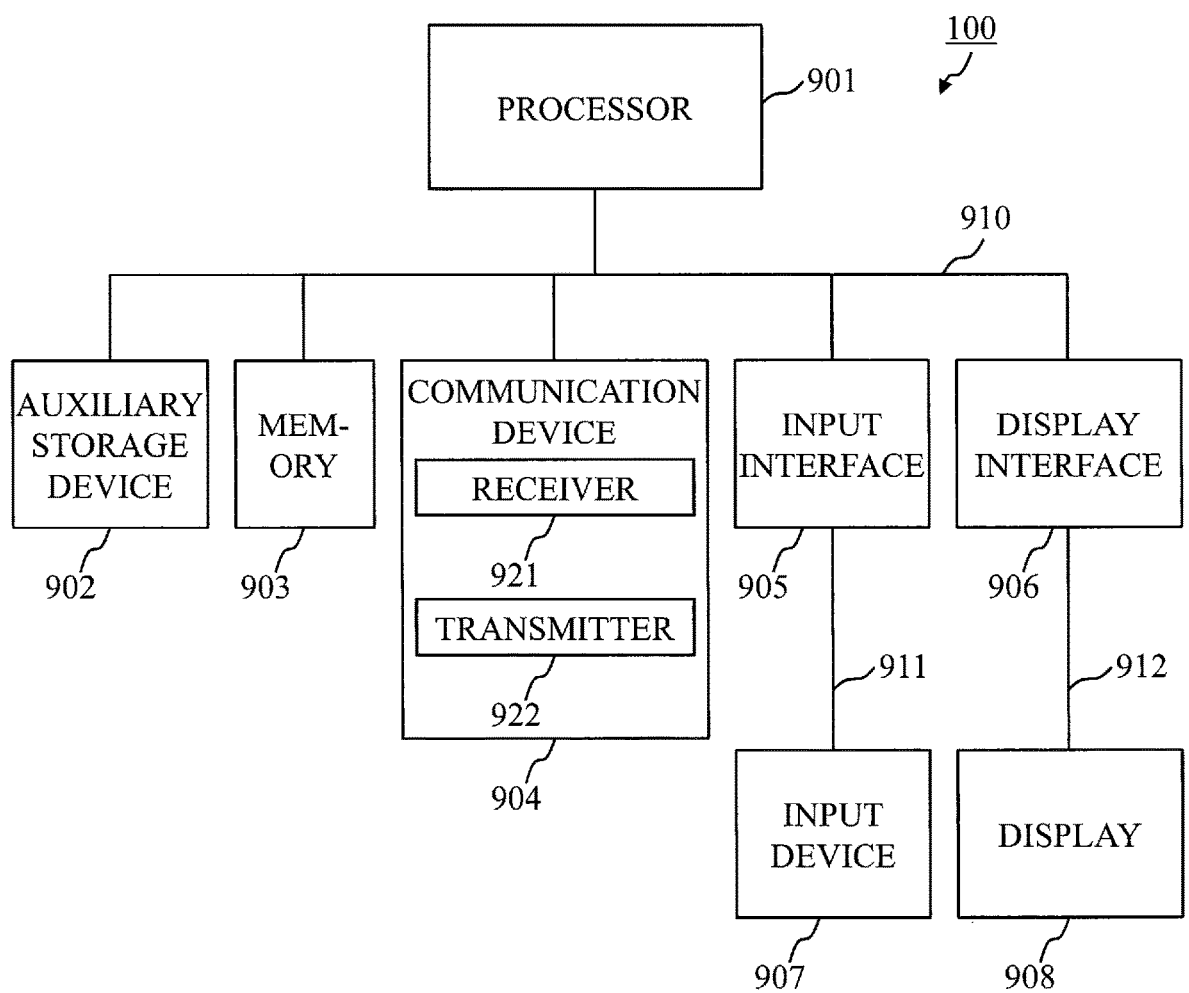
FIG. 9 is a diagram illustrating an example of a hardware configuration of the simulation apparatus according to each embodiment of the present invention.

Though FIG. 9 illustrates one processor 901, the simulation apparatus 100 may include a plurality of processors 901. Then, the plurality of processors 901 may cooperate and execute programs to implement the functions of the "units".

Information, data, signal values, and variable values indicating results of processes executed by the "units" are stored in the auxiliary storage device 902, the memory 903, or a register or a cache memory in the processor 901.

The "units" may be provided as "circuitry". Alternatively, a "unit" may be read as a "circuit", a "step", a "procedure", or a "process". The "circuit" and the "circuitry" are each a concept including not only the processor 901 but also a processing circuit of a different type such as a logic IC, a gate array (GA), an application specific integrated circuit (ASIC), or a field-programmable gate array (FPGA).

Embodiments of the present invention have been described above; some of these embodiments may be combined to be carried out. Alternatively, any one or some of these embodiments may be partially carried out. Only one of the "units" described in the descriptions of these embodiments may be adopted, or an arbitrary combination of some of the "units" may be adopted, for example. The present invention is not limited to these embodiments, and various modifications are possible as necessary.

REFERENCE SIGNS LIST

100: simulation apparatus; 101: selection unit; 102: simulation unit; 103: adjustment unit; 104: time management unit; 121: decode processing unit; 122: conversion processing unit; 123: execution processing unit; 131: core determination unit; 132: timing management unit; 200: storage medium; 201: context information X; 202: context information Y; 250: definition table; 251: definition information; 260: function disposition map; 301: target instruction code; 302: host instruction code; 500: system; 510: multi-core CPU; 511: core X; 512: core Y; 513: L1 cache; 514: L1 cache; 515: L2 cache; 520: memory; 530: I/O; 901: processor; 902: auxiliary storage device; 903: memory; 904: communication device; 905: input interface; 906: display interface; 907: input device; 908: display; 910: signal line; 911: cable; 912: cable; 921: receiver; 922: transmitter

The invention claimed is:

1. A simulation apparatus to simulate parallel processing operations of a system including a plurality of components to individually execute instructions of a program, the simulation apparatus comprising:
    processing circuitry
        to repetitively select context information individually generated for each of the plurality of components and indicating an instruction to be executed by a corresponding one of the plurality of components, and
        to simulate execution of the instruction indicated by the context information corresponding to a component during a period from when the context information corresponding to the component is selected till when the context information corresponding to another component is selected; and
    a storage medium to store definition information to individually define a length of the period by specifying a number of instructions whose execution is to be successively simulated, for one or some instructions out of the instructions to be executed by the plurality of components,
    wherein if the instruction whose execution is to be simulated is the one or some instructions, then after the context information corresponding to a component to execute the one or some instructions is selected, the processing circuitry selects the context information corresponding to another component when execution of one or more instructions, the number of which is specified by the definition information stored in the storage medium, has been simulated, and if the instruction whose execution is to be simulated is a different instruction from the one or some instructions, then after the context information corresponding to a component to execute the different instruction is selected, the processing circuitry selects the context information corresponding to another component when execution of one or more instructions, a number of which is a fixed number, has been simulated, and
    wherein if the instruction whose execution is to be simulated is the different instruction, then after the context information corresponding to the component to execute the different instruction is selected, the processing circuitry selects the context information corresponding to another component when execution of a branch or synchronization instruction has been simulated even before the execution of the one or more instructions, the number of which is the fixed number, is simulated.

2. The simulation apparatus according to claim 1, wherein the plurality of components are a plurality of cores of a processor.

3. The simulation apparatus according to claim 1, wherein the plurality of components are a plurality of processors.

4. A simulation apparatus to simulate parallel processing operations of a system including a plurality of components to individually execute instructions of a program, the simulation apparatus comprising:

processing circuitry to repetitively select context information individually generated for each of the plurality of components and indicating an instruction to be executed by a corresponding one of the plurality of components, and to simulate execution of the instruction indicated by the context information corresponding to a component during a period from when the context information corresponding to the component is selected till when the context information corresponding to another component is selected; and a storage medium to store definition information to individually define a length of the period for at least one or some instructions out of the instructions to be executed by the plurality of components, wherein if the instruction whose execution is to be simulated is the at least one or some instructions, then after the context information corresponding to a component to execute the at least one or some instructions is selected, the processing circuitry adjusts a timing for selecting the context information corresponding to another component according to the definition information stored in the storage medium, and wherein the definition information defines the length of the period for each address range of a memory included in the system, where the at least one or some instructions are stored.

5. The simulation apparatus according to claim 4, wherein the plurality of components are a plurality of cores of a processor.

6. The simulation apparatus according to claim 4, wherein the plurality of components are a plurality of processors.

7. A simulation apparatus to simulate parallel processing operations of a system including a plurality of components to individually execute instructions of a program, the simulation apparatus comprising:

processing circuitry to repetitively select context information individually generated for each of the plurality of components and indicating an instruction to be executed by a corresponding one of the plurality of components, and to simulate execution of the instruction indicated by the context information corresponding to a component during a period from when the context information corresponding to the component is selected till when the context information corresponding to another component is selected; and a storage medium to store definition information to individually define a length of the period for at least one or some instructions out of the instructions to be executed by the plurality of components, wherein if the instruction whose execution is to be simulated is the at least one or some instructions, then after the context information corresponding to a component to execute the at least one or some instructions is selected, the processing circuitry adjusts a timing for selecting the context information corresponding to another component according to the definition information stored in the storage medium, and wherein the definition information defines the length of the period for each identifier to identify, among functions included in the program, a function corresponding to the at least one or some instructions.

8. The simulation apparatus according to claim 7, wherein the plurality of components are a plurality of cores of a processor.

9. The simulation apparatus according to claim 7, wherein the plurality of components are a plurality of processors.

10. A simulation method of simulating parallel processing operations of a system including a plurality of components to individually execute instructions of a program, the simulation method comprising:

by a computer including a storage medium, repetitively selecting context information individually generated for each of the plurality of components and indicating an instruction to be executed by a corresponding one of the plurality of components;

by the computer, simulating execution of the instruction indicated by the context information corresponding to a component during a period from when the context information corresponding to the component is selected till when the context information corresponding to another component is selected, the storage medium having stored therein definition information to individually define a length of the period by specifying a number of instructions whose execution is to be successively simulated, for one or some instructions out of the instructions to be executed by the plurality of components; and by the computer, if the instruction whose execution is to be simulated is the one or some instructions, then after the context information corresponding to a component to execute the one or some instructions is selected, selecting the context information corresponding to another component when execution of one or more instructions, the number of which is specified by the definition information stored in the storage medium, has been simulated, and, if the instruction whose execution is to be simulated is a different instruction from the one or some instructions, then after the context information corresponding to a component to execute the different instruction is selected, selecting the context information corresponding to another component when execution of one or more instructions, a number of which is a fixed number, has been simulated.

11. A non-transitory computer readable medium storing a simulation program to simulate parallel processing operations of a system including a plurality of components to individually execute instructions of a program, the simulation program causing a computer including a storage medium to execute:

a selection process of repetitively selecting context information individually generated for each of the plurality of components and indicating an instruction to be executed by a corresponding one of the plurality of components;

a simulation process of simulating execution of the instruction indicated by the context information corresponding to a component during a period from when the context information corresponding to the component is selected by the selection process till when the context information corresponding to another component is selected by the selection process, the storage medium having stored therein definition information to individually define a length of the period by specifying a number of instructions whose execution is to be successively simulated by the simulation process, for one or some instructions out of the instructions to be executed by the plurality of components; and an adjustment process of, if the instruction whose execution is to be simulated by the simulation process is the one or some instructions, then after the context information corresponding to a component to execute the one or some instructions is selected by the selection process, causing the selection process to select the context information corresponding to another component when execution of one or more instructions, the number of which is specified by the definition information stored in the storage medium, has been simulated by the simulation process, and of, if the instruction whose execution is to be simulated by the simulation process is a different instruction from the one or some instructions, then after the context information corresponding to a component to execute the different instruction is selected by the selection process, causing the selection process to select the context information corresponding to another component when execution of one or more instructions, a number of which is a fixed number, has been simulated by the simulation process.

12. A simulation method of simulating parallel processing operations of a system including a plurality of components to individually execute instructions of a program, the simulation method comprising:

by a computer including a storage medium, repetitively selecting context information individually generated for each of the plurality of components and indicating an instruction to be executed by a corresponding one of the plurality of components;

by the computer, simulating execution of the instruction indicated by the context information corresponding to a component during a period from when the context information corresponding to the component is selected till when the context information corresponding to another component is selected, the storage medium having stored therein definition information to individually define a length of the period for at least one or some instructions out of the instructions to be executed by the plurality of components; and by the computer, if the instruction whose execution is to be simulated is the at least one or some instructions, then after the context information corresponding to a component to execute the at least one or some instructions is selected, adjusting a timing for selecting the context information corresponding to another component according to the definition information stored in the storage medium, wherein the definition information defines the length of the period for each address range of a memory included in the system, where the at least one or some instructions are stored.

13. A simulation method of simulating parallel processing operations of a system including a plurality of components to individually execute instructions of a program, the simulation method comprising:

by a computer including a storage medium, repetitively selecting context information individually generated for each of the plurality of components and indicating an instruction to be executed by a corresponding one of the plurality of components;

by the computer, simulating execution of the instruction indicated by the context information corresponding to a component during a period from when the context information corresponding to the component is selected till when the context information corresponding to another component is selected, the storage medium having stored therein definition information to individually define a length of the period for at least one or some instructions out of the instructions to be executed by the plurality of components; and by the computer, if the instruction whose execution is to be simulated is the at least one or some instructions, then after the context information corresponding to a component to execute the at least one or some instructions is selected, adjusting a timing for selecting the context information corresponding to another component according to the definition information stored in the storage medium, wherein the definition information defines the length of the period for each identifier to identify, among functions included in the program, a function corresponding to the at least one or some instructions.

14. A non-transitory computer readable medium storing a simulation program to simulate parallel processing operations of a system including a plurality of components to individually execute instructions of a program, the simulation program causing a computer including a storage medium to execute:

a selection process of repetitively selecting context information individually generated for each of the plurality of components and indicating an instruction to be executed by a corresponding one of the plurality of components;

a simulation process of simulating execution of the instruction indicated by the context information corresponding to a component during a period from when the context information corresponding to the component is selected by the selection process till when the context information corresponding to another component is selected by the selection process, the storage medium having stored therein definition information to individually define a length of the period for at least one or some instructions out of the instructions to be executed by the plurality of components; and an adjustment process of, if the instruction whose execution is to be simulated by the simulation process is the at least one or some instructions, then after the context information corresponding to a component to execute the at least one or some instructions is selected by the selection process, adjusting a timing for causing the selection process to select the context information corresponding to another component according to the definition information stored in the storage medium, wherein the definition information defines the length of the period for each address range of a memory included in the system, where the at least one or some instructions are stored.

15. A non-transitory computer readable medium storing a simulation program to simulate parallel processing operations of a system including a plurality of components to individually execute instructions of a program, the simulation program causing a computer including a storage medium to execute:

a selection process of repetitively selecting context information individually generated for each of the plurality of components and indicating an instruction to be executed by a corresponding one of the plurality of components;

a simulation process of simulating execution of the instruction indicated by the context information corresponding to a component during a period from when the context information corresponding to the component is selected by the selection process till when the context information corresponding to another component is selected by the selection process, the storage medium having stored therein definition information to individually define a length of the period for at least one or some instructions out of the instructions to be executed by the plurality of components; and an adjustment process of, if the instruction whose execution is to be simulated by the simulation process is the at least one or some instructions, then after the context information corresponding to a component to execute the at least one or some instructions is selected by the selection process, adjusting a timing for causing the selection process to select the context information corresponding to another component according to the definition information stored in the storage medium, wherein the definition information defines the length of the period for each identifier to identify, among functions included in the program, a function corresponding to the at least one or some instructions.

* * * * *